(12) United States Patent
Pazhayaveetil et al.

(10) Patent No.: US 9,742,370 B2
(45) Date of Patent: Aug. 22, 2017

(54) BOOST CONVERTER VOLTAGE CONTROLLED BASED ON AUDIO SIGNAL

(71) Applicant: Cirrus Logic, Inc., Austin, TX (US)

(72) Inventors: Ullas Pazhayaveetil, Cedar Park, TX (US); Jeffrey May, Dripping Springs, TX (US); Anu Chakravarty, Austin, TX (US); Gautham D. Kamath, Austin, TX (US); John C. Tucker, Austin, TX (US); Christian Larsen, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/350,431

(22) Filed: Nov. 14, 2016

(65) Prior Publication Data

US 2017/0063318 A1    Mar. 2, 2017

Related U.S. Application Data

(62) Division of application No. 14/182,798, filed on Feb. 18, 2014, now Pat. No. 9,520,782.

(60) Provisional application No. 61/858,939, filed on Jul. 26, 2013.

(51) Int. Cl.
| | | |
|---|---|---|
| *H03G 3/00* | (2006.01) |
| *G01R 27/26* | (2006.01) |
| *G01R 21/06* | (2006.01) |
| *G06F 1/32* | (2006.01) |
| *H02M 3/158* | (2006.01) |
| *H03F 3/187* | (2006.01) |
| *H03F 3/217* | (2006.01) |

(52) U.S. Cl.
CPC ............. *H03G 3/004* (2013.01); *G01R 21/06* (2013.01); *G01R 27/2611* (2013.01); *G06F 1/3203* (2013.01); *H02M 3/158* (2013.01); *H03F 3/187* (2013.01); *H03F 3/2175* (2013.01)

(58) Field of Classification Search
None
See application file for complete search history.

(56) References Cited

U.S. PATENT DOCUMENTS

| | | |
|---|---|---|
| 6,087,816 A | 7/2000 | Volk |
| 7,265,530 B1 | 9/2007 | Broach et al. |
| 7,425,819 B2 | 9/2008 | Isobe |
| 7,737,668 B2 | 6/2010 | Oswald et al. |
| 7,898,825 B2 | 3/2011 | Mulligan et al. |
| 8,278,899 B2 | 10/2012 | Schafmeister et al. |
| 8,525,502 B2 | 9/2013 | Weinstein et al. |
| 8,643,436 B2 | 2/2014 | Ni et al. |
| 2005/0168198 A1 | 8/2005 | Maksimovic et al. |
| 2006/0284607 A1 | 12/2006 | Isobe |

(Continued)

*Primary Examiner* — Paul Huber
(74) *Attorney, Agent, or Firm* — Norton Rose Fulbright US LLP

(57) ABSTRACT

Audio amplification may be improved by controlling an audio amplifier based on the audio signal being amplified. For example, when the audio signal level increases or decreases, a boost voltage provided to an audio amplifier by a boost converter may also be increased or decreased. In another example, when the audio signal level decrease below a certain level, the audio amplifier may be switched from amplifying the audio signal with a boost converter input to amplifying the audio signal with a low voltage input. Control of the audio amplifier may be implemented in a digital boost converter controller coupled to the boost converter and/or the audio amplifier.

20 Claims, 6 Drawing Sheets

(56) References Cited

U.S. PATENT DOCUMENTS

| | | |
|---|---|---|
| 2009/0010035 A1 | 1/2009 | Williams |
| 2009/0054023 A1 | 2/2009 | Bean et al. |
| 2011/0109283 A1 | 5/2011 | Kapels et al. |
| 2012/0182001 A1 | 7/2012 | Huang et al. |
| 2013/0057529 A1 | 3/2013 | Lee et al. |
| 2013/0069613 A1 | 3/2013 | Nakase et al. |
| 2013/0257533 A1 | 10/2013 | Krabbenborg et al. |
| 2014/0125303 A1 | 5/2014 | Dagan et al. |
| 2014/0270240 A1 | 9/2014 | Solomon et al. |
| 2014/0347027 A1 | 11/2014 | Jayaraj et al. |

BOOST CONVERTER VOLTAGE CONTROLLED BASED ON AUDIO SIGNAL

FIELD OF THE DISCLOSURE

This application is a divisional of U.S. NonProvisional application Ser. No. 14/182,798 to Ullas Pazhayaveetil et al. filed on Feb. 18, 2014 and entitled "Boost Converter Voltage Controlled Based on Audio Signal," which claims benefit of priority to U.S. Provisional Patent No. 61/858,939 to Ullas Pazhayaveetil et al. filed on Jul. 26, 2013 and entitled "Methods and Apparatuses for Digitally Regulated Peak Current Mode Controlled Boost Converter with Dynamic Level Adjustment," both of which are herein incorporated by reference.

FIELD OF THE DISCLOSURE

The instant disclosure relates to an audio amplifier. In particular, the instant disclosure relates to power converters for audio amplifiers.

BACKGROUND

Portable devices are becoming more common in every aspect of our lives and affect how we interact with our music. For example, many consumers listen to their music from portable audio players, such as MP3 players or their cellular phones. These portable devices become easier and more enjoyable to use when the portable devices shrink in size while offering the same capabilities and when the portable devices can last longer from a single battery charge. To support longer lasting devices, the operating voltage of the components inside the portable device is often reduced to reduce power consumption by these components. However, a reduction in operating voltage affects the sound output of the portable device, because the volume level of an audio signal output to a speaker is proportional to the output voltage. Thus, boost converters have been used to increase operating voltages for select components within a portable device that benefit from higher voltages, such as the audio amplifier that needs high voltages to generate high volumes.

FIG. 1 is a conventional audio amplifier with a boost converter. An audio amplifier 100 for a mobile device includes a battery supply 102 that provides a voltage, $V_p$, to a boost converter 104. The boost converter 104 increases the voltage $V_p$ to a boost voltage, $V_{bst}$. A speaker amplifier 108 receives the boost voltage, $V_{bst}$, and an analog audio signal, sig, from a digital-to-analog converter (DAC) 106. The speaker amplifier 108 increases the low power signal of the audio signal, sig, with power received from the boost converter 104 to generate a signal to drive a speaker 110. The boost voltage, $V_{bst}$, is higher than the supply voltage, $V_p$, which allows the speaker amplifier 108 to provide louder volume ranges through the speaker 110 than possible with only the supply voltage, $V_p$.

However, providing the boost voltage, $V_{bst}$, to the speaker amplifier 108 has drawbacks, such as increased power consumption. That is, because the speaker amplifier 108 is receiving the boost voltage, $V_{bst}$, even if volume levels are low, then the speaker amplifier 108 is wasting power. This wasted power shortens the operating time of a portable device between charges and hurts the user's experience with the portable device. Additional inefficiencies exist, such as undesirable power consumption and transients that occur when the speaker 110 is connected and disconnected from the speaker amplifier 108 while the amplifier 108 is receiving the boosted voltage, $V_{bst}$. Further, the increased power consumption by the speaker amplifier 108 may cause thermal management problems. Particularly as portable devices shrink in size and have less space for heat dissipation, the speaker amplifier 108 may be constrained in volume ranges it can provide by heat buildup in the speaker amplifier 108 or the boost converter 104. Each of these shortcomings is due to the static nature of the boost voltage, $V_{bst}$, provided to the speaker amplifier 108.

Shortcomings mentioned here are only representative and are included simply to highlight that a need exists for improved audio amplifiers, particularly for consumer-level devices. Embodiments described here address certain shortcomings but not necessarily each and every one described here or known in the art.

SUMMARY

Audio amplification may be improved by controlling an audio amplifier based on the audio signal being amplified. For example, when the audio signal level increases or decreases, a boost voltage provided to an audio amplifier by a boost converter may also be increased or decreased. In another example, when the audio signal level decrease below a certain level, the audio amplifier may be switched from amplifying the audio signal with a boost converter input to amplifying the audio signal with a low voltage input. Control of the audio amplifier may be implemented in a digital boost converter controller coupled to the boost converter and/or the audio amplifier.

In one embodiment, an apparatus may include an input node configured to receive an audio signal; an audio amplifier; a boost converter coupled to the audio amplifier and configured to output a boost voltage to the audio amplifier. The boost converter may include an inductor coupled to a supply voltage; a capacitor coupled to the audio amplifier; a first switch coupled to the inductor and to a ground; and a second switch coupled to the first switch and to the audio amplifier. The apparatus may also include a controller coupled to the boost converter and the input node and configured to control the boost voltage of the boost converter based, at least in part, on the audio signal.

In some embodiments, the apparatus may also include a low voltage converter coupled to the audio amplifier and configured to output a low voltage to the audio amplifier, wherein the controller is further configured to switch the audio amplifier between the boost voltage and the low voltage; and/or an audio buffer coupled to the input node and configured to buffer the audio signal, wherein the controller is configured to control the boost converter based, at least in part, on the buffered audio signal.

In certain embodiments, the boost voltage may be larger than a supply voltage and the low voltage may be lower than the supply voltage; the controller may configure the boost converter to generate a boost voltage equal to approximately a sum of an amplitude of the audio signal and a headroom value; the controller may be configured to increase the boost voltage at a first rate during an increase of the audio signal and decrease the boost voltage at a second slower rate during a decrease of the audio signal; and/or the audio amplifier, the boost converter, and the controller may be integrated into an integrated circuit (IC).

In another embodiment, a method may include receiving, at a controller, an audio signal; configuring, by the controller, a boost converter for a boost voltage based, at least in part, on the received audio signal, wherein the boost converter generates the boost voltage by: building current in an inductor in a first phase and discharging current from the inductor to a capacitor during a second phase; and amplifying, at an amplifier coupled to the processor and the boost converter, the audio signal based, at least in part, on the boost voltage of the boost converter.

In some embodiments, the method may also include configuring, by the controller, the amplifier to amplify the audio signal with a low voltage based, at least in part, on the received audio signal, wherein the step of configuring the amplifier may include configuring the amplifier to amplify the audio signal with a low voltage lower than a supply voltage and configuring the amplifier to amplify the audio signal with a boost voltage higher than the supply voltage; and/or buffering the audio signal in a buffered audio signal, wherein the configuring is based on the buffered audio signal and wherein the amplifying comprises amplifying the buffered audio signal.

In certain embodiments, the step of configuring the boost converter may include configuring the boost converter to output a voltage approximately equal to a sum of an amplitude of the audio signal and a headroom value; the step of configuring the boost converter may include increasing the boost voltage at a first rate when the audio signal increases and decreasing the boost voltage at a second slower rate when the audio signal decreases; and/or the steps of configuring and amplifying are performed by a single integrated circuit (IC).

In yet another embodiment, an integrated circuit may include an input node configured to receive an audio signal; an output node configured to output an amplified audio signal to drive a load; an audio amplifier coupled to the input node and configured to amplify the audio signal to generate the amplified audio signal; a boost converter coupled to the audio amplifier and configured to generate a boost voltage; a low voltage converter coupled to the audio amplifier and configured to generate a low voltage; and/or a controller coupled to the boost converter, the input node, and the low voltage converter. The boost converter may include an inductor coupled to a supply voltage, a capacitor coupled to the audio amplifier, a first switch coupled to the inductor and to a ground, and a second switch coupled to the first switch and to the audio amplifier. The controller may be configured to receive the audio signal, configure the audio amplifier for amplifying the audio signal based on the low voltage when the audio signal is smaller in amplitude than the low voltage, and/or configure the audio amplifier for amplifying the audio signal based on the boost voltage when the audio signal is higher in amplitude than the low voltage.

In some embodiments, the integrated circuit may also include an audio buffer coupled to the input node and coupled to the controller and configured to buffer the audio signal into a buffered audio signal, wherein the controller is configured to configure the boost converter based, at least in part, on the buffered audio signal.

In certain embodiments, the controller may be further configured to configure the boost converter to produce a variable boost voltage based, at least in part, on the received audio signal; the controller may be configured to configure the boost converter to produce the variable boost voltage approximately equal to a sum of the amplitude of the audio signal and a headroom value; and/or the low voltage converter is a low-voltage dropout (LDO) converter.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 2:
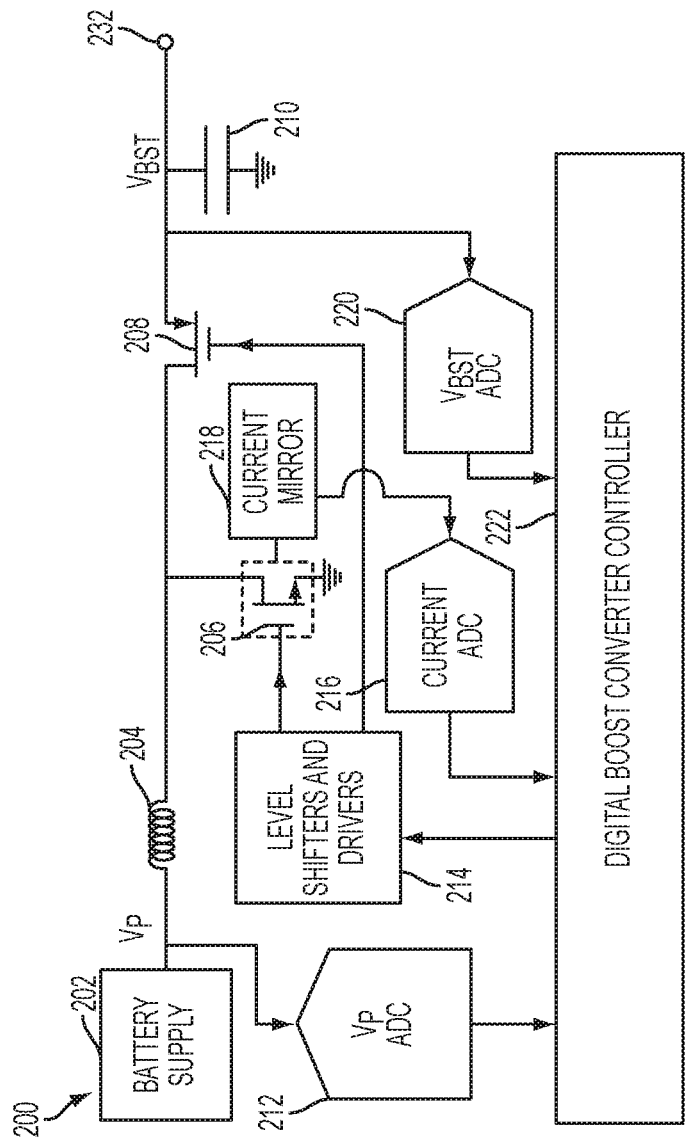
FIG. 2 is a block diagram of an audio amplifier with a dynamically-controlled boost converter according to one embodiment of the disclosure.

FIG. 2 is a block diagram of an audio amplifier with a dynamically-controlled boost converter according to one embodiment of the disclosure. A circuit 200 may include a battery supply 202, which provides a voltage, $V_p$, to the circuit 200. The circuit 200 may also include an inductor 204, with an inductance value, $L_{boost}$, coupled to an n-channel field effect transistor (NFET) 206, a p-channel field effect transistor (PMOS) 208, and a capacitor 210, having a capacitance value $C_{boost}$.

The configuration of the components 204, 206, 208, and 210 allow a digital boost converter controller 222 to generate a boost voltage, $V_{bst}$, higher than the supply voltage, $V_p$. For example, during a first time period the NFET 206 may be switched on to a conducting state to couple the inductor 204 with ground, while the PFET 208 is switched off to a non-conducting state. This causes the supply voltage, $V_p$, to be placed across the inductor 204, current to flow through the inductor 204, and energy to be stored in the inductor 204. Then, during a second time period the NFET 206 may be switched off to a non-conducting state while the PFET 208 is switched on to a conducting state. This causes the inductor 204 to couple to ground through the capacitor 210. Thus, energy stored in the inductor 204 is transferred to the capacitor 210. As energy is stored in the capacitor 210, the voltage across the capacitor 210 increases and allows the boost voltage, $V_{bst}$, at output node 232 to increase beyond the supply voltage, $V_p$. An audio amplifier (not shown) may be coupled to the output node 232 to receive the boosted voltage, $V_{bst}$. The controller 222 may control operation of the NFET 206 and the PFET 208 to control a duration of the first time period and the second time period, which regulates the transfer of power from the inductor 204 to the capacitor 210 and thus regulates the level of the boost voltage, $V_{bst}$.

The controller 222 may receive one or more inputs that provide information to allow the controller 222 to control operation of the circuit 200. For example, the controller 222 may be coupled to an analog-to-digital converter (ADC) 212 that provides the controller 222 with information about the voltage level of the supply voltage, $V_p$. In another example, the controller 222 may be coupled to an analog-to-digital converter (ADC) 216 that provides the controller 222 with information about a current level through the inductor 204. The ADC 216 may determine the current through the inductor 204 through a current mirror 218 coupled to the NFET 206. In yet another example, an analog-to-digital converter (ADC) 220 may be coupled to the controller 222 to provide information about the boost voltage, $V_{bst}$, level.

Figure 1:
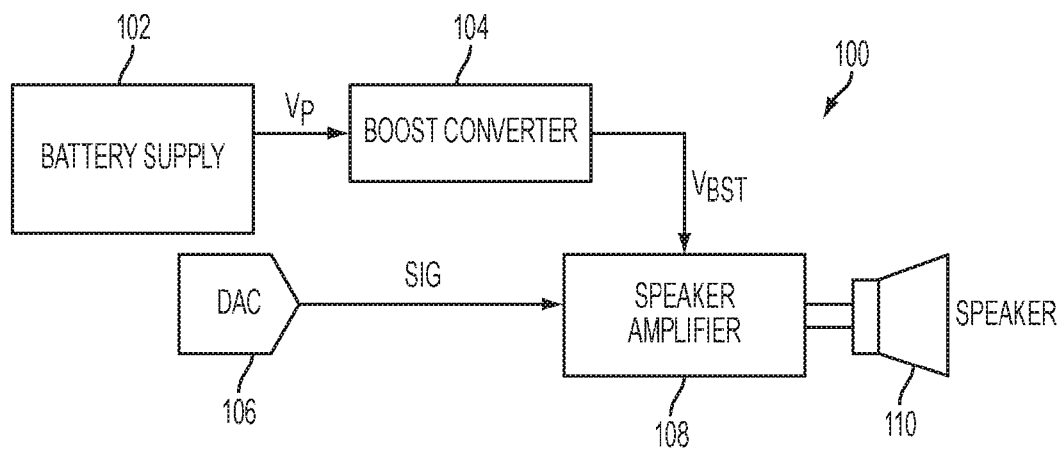
FIG. 1 is a conventional audio amplifier with a boost converter.

The circuit 200 may allow the controller 222 to control the level of the boost voltage, $V_{bst}$. In comparison, the conventional audio amplifier with boost converter of FIG. 1 described above provides only a static boost voltage to the speaker amplifier, which leads to poor efficiency and shortened battery life due to the large headroom that is wasted during low levels of audio output. In one embodiment, the controller 222 of FIG. 2 may receive information regarding the audio signal being amplified by an amplifier using the boost voltage, $V_{bst}$, such as whether the signal is at a loud moment or a soft moment in a song. During loud moments, the controller 222 may control level shifters and drivers 214 coupled to the NFET 206 and the PFET 208 to increase the boost voltage, $V_{bst}$, generated by the inductor 204 and the capacitor 210. During soft moments, the controller 222 may control level shifters and drivers 214 coupled to the NFET 206 and the PFET 208 to decrease the boost voltage, $V_{bst}$, generated by the inductor 204 and the capacitor 210. Thus, power consumption by the circuit 200 is reduced by the controller 222 during quiet moments of an audio signal.

Figure 3:
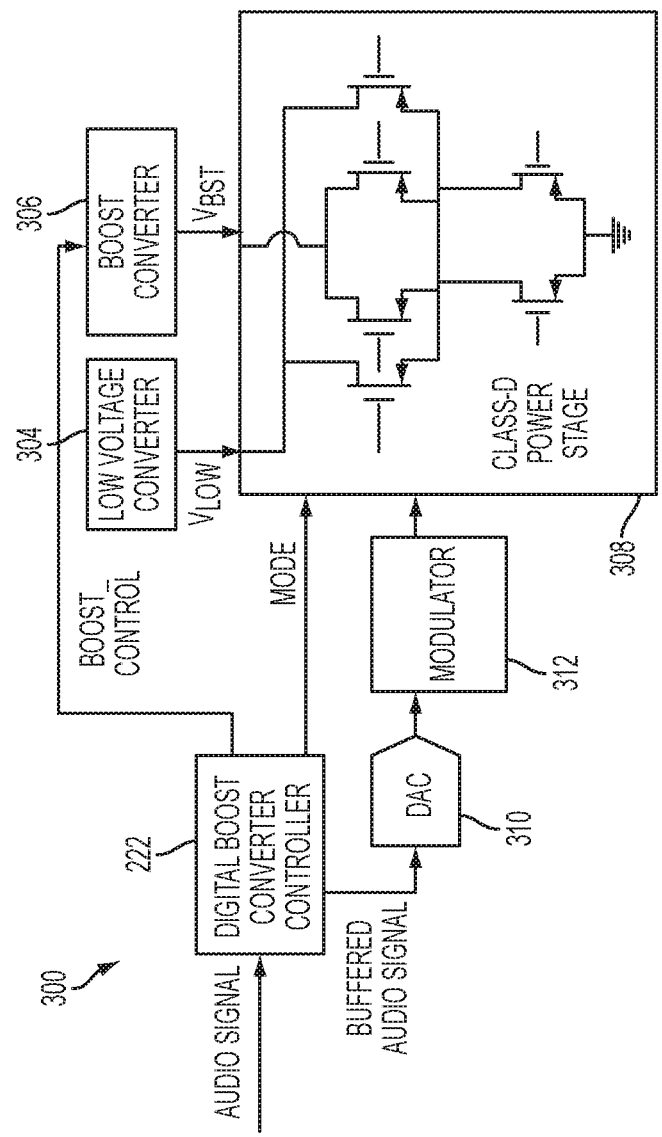
FIG. 3 is a block diagram illustrating operation of an audio amplifier from both a boost voltage and a low voltage according to one embodiment of the disclosure.

In one embodiment, the controller 222 may be configured to switch an audio amplifier between operating from a boost voltage, $V_{bst}$, and a low voltage, $V_{low}$, depending on the audio signal being amplified. This allows the audio amplifier to discontinue use of the boost converter when not needed to generate a desired output level in a speaker or headphone, which may further increase efficiency and decrease battery consumption. In one embodiment, an audio amplifier may be switched between a Class H amplifier and a Class G amplifier depending on the audio signal being amplifier. FIG. 3 is a block diagram illustrating operation of an audio amplifier from both a boost voltage and a low voltage according to one embodiment of the disclosure. A circuit 300 may include an amplifier 308, such as a class D power stage amplifier. The amplifier 308 may be configured to receive an input voltage from a low voltage converter 304 and a boost converter 306. In some embodiments, the low voltage converter 304 may be a low-dropout regulator (LDO) and the boost converter 306 may include an inductor, capacitor, NFET, and PFET similar to that described above with reference to FIG. 2. The amplifier 308 may also be configured to receive an audio signal from a modulator 312, such as a class D modulator. The modulator 312 receives the audio signal for output at a speaker or headphone through a digital-to-analog converter (DAC) 310 and modulates the audio signal to generate the appropriate signals for a speaker or headphone. The amplifier 308 amplifies the modulated signal received from the modulator 312 using an input voltage from either the boost converter 306 or the low voltage converter 304 to reach a desired volume level at a headphone or speaker.

The controller 222 also receives the audio signal for output at the speaker or headphone and produces one or more control signals for controlling the amplifier 308 based on the audio signal. For example, the controller 222 may output a Boost_control signal to the boost converter 306 that varies the level of a boost voltage, $V_{bst}$, provided to the amplifier 308. In another example, the controller 222 may output a mode signal to the amplifier 308 that controls the amplifier 308 to amplify the modulated audio signal received from the modulator 312 based on either the low voltage, $V_{low}$, or the boost voltage, $V_{bst}$.

Switching between the $V_{low}$ and the $V_{bst}$ voltage and/or controlling the level of the $V_{bst}$ voltage allows the headroom, which is the unused voltage above that required to amplify the audio signal, to be reduced. For example, when the audio signal only requires 0.8 Volts for amplification at the amplifier 308 and the low voltage is 1.0 Volts, then the amplifier 308 may be switched to operate from the $V_{low}$ signal, leaving a headroom of 1.0−0.8=0.2 Volts. If a maximum boost voltage, $V_{bst}$, is 10 Volts then the static audio amplifier of FIG. 1 would have a headroom of 10−0.8=9.2 Volts, which wastes more energy than the embodiment of FIG. 3. In another example, when the audio signal only requires 5.2 Volts for amplification at the amplifier 308, then the amplifier 308 may be switched to operate from the $V_{bst}$ signal and the $V_{bst}$ signal controlled to a level of 5.4 Volts, leaving a headroom of 5.4−5.2 Volts=0.2 Volts. In comparison, the static audio amplifier of FIG. 1 would have a headroom of 10−5.2 Volts=4.8 Volts, which wastes more energy than the embodiment of FIG. 3.

The controller 222 may predict an audio output amplitude level for the amplifier 308 based on the audio signal. Then, a buffered audio signal is provided to the DAC 310 to feed to the amplifier 308. The buffered audio signal may be delayed to match latency introduced by latency of the controller 222. Although two modes are described above, the controller 222 may switch the amplifier 308 into additional modes. For example, the controller 222 may switch the amplifier 308 between three modes: a class G mode in which the amplifier 308 is driven by the low voltage converter 304, a commutation mode in which the PFET 208 of FIG. 2 is switched on to pass the supply voltage to the audio amplifier 308, and a class H mode in which the amplifier 308 is driven by the boost converter 306 and the level of the boost voltage, $V_{bst}$, is dynamically controlled.

The multiple modes of operation of the amplifier 308 under direction of the controller 222 decreases power consumption by reducing wasted voltage headroom. Additionally, decreasing the headroom reduces electromagnetic interference (EMI) and output noise at the speaker or earphones caused by operation of the amplifier 308 at high voltages.

Figure 4:
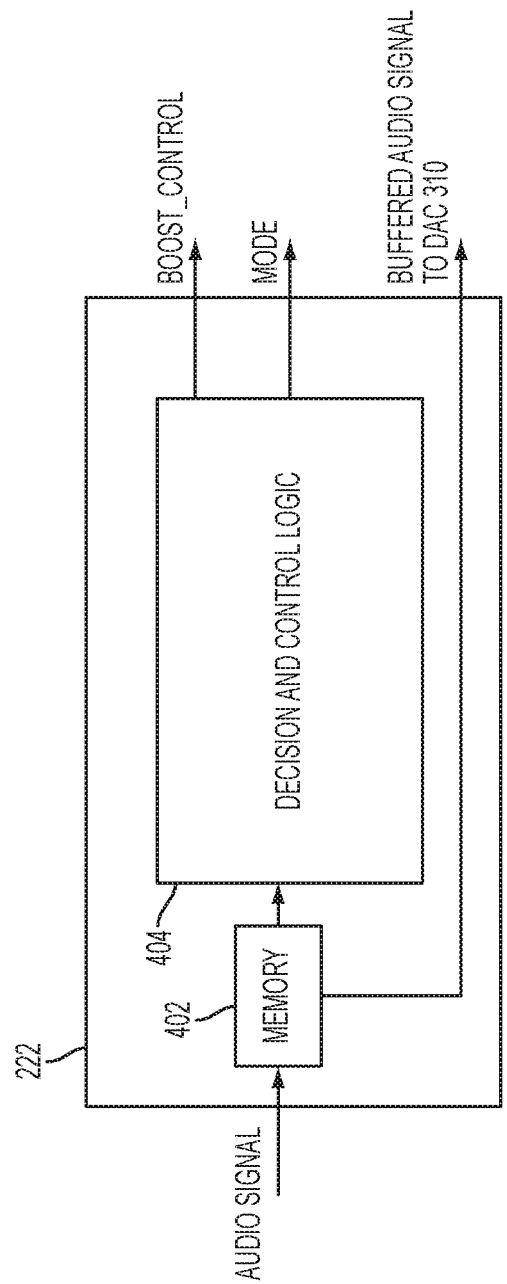
FIG. 4 is a block diagram illustrating a controller for an audio amplifier and boost converter according to one embodiment.

One embodiment of the controller 222 is shown in FIG. 4. FIG. 4 is a block diagram illustrating a controller for an audio amplifier and boost converter according to one embodiment. The controller 222 may include memory 402 and decision and control logic 404. The memory 402 may store a received audio signal, which is provided to the decision and control logic 404 and also provided as a buffered audio signal to the DAC 310 of FIG. 3. The decision and control logic 404 may include, for example, digital or analog circuitry for controlling an audio amplifier. In one embodiment, the logic 404 may be a processor. In another embodiment, the logic 404 may be an application specific integrated circuit (ASIC). The logic 404 may generate one or more control signals, including a Boost_control signal for controlling the boost converter 306 and a mode signal for controlling the amplifier 308.

In one embodiment, the controller 222 may be an integrated circuit (IC) including the memory 402. In another embodiment, the controller 222, the memory 402, and an audio amplifier may be combined in a single integrated circuit (IC). In yet another embodiment, the controller 222, the memory 402, an audio amplifier, a boost converter, and/or a low voltage converter may be combined in a single integrated circuit (IC).

Figure 5:
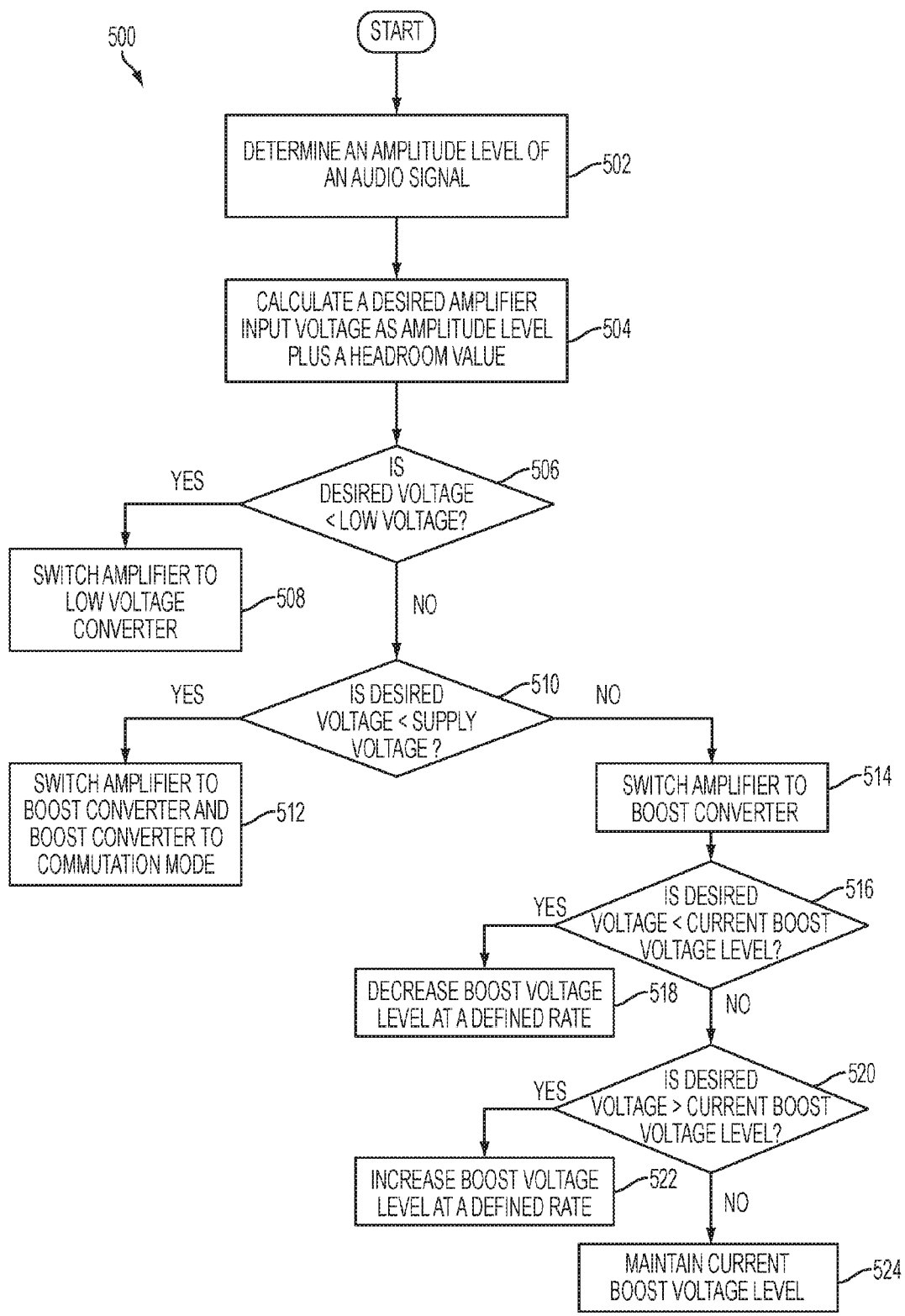
FIG. 5 is a flow chart illustrating a method for controlling an amplifier and a boost converter according to one embodiment of the disclosure.

The decision and control logic 404 may implement a method such as that shown in FIG. 5. FIG. 5 is a flow chart illustrating a method for controlling an amplifier and a boost converter according to one embodiment of the disclosure. A method 500 may begin at block 502 with determining an amplitude level of an audio signal. At block 504, a desired amplifier input voltage may be calculated as the amplitude level of 502 plus a headroom value, which may be fixed, such as 0.2 Volts, or variable.

At block 506, it is determined whether the desired voltage of block 504 is less than a low voltage, $V_{low}$. If so, then the method 500 proceeds to block 508 to switch the amplifier to operate from the low voltage converter. If not, then the method 500 determines at block 510 whether the desired voltage is less than a supply voltage. If so, then the method 500 proceeds to block 512 to switch the amplifier to the boost converter and to configure the boost converter to operate in commutation mode. If not, then the method 500 switches the amplifier to the boost converter at block 514.

At block 516, it is determined whether the desired voltage of block 504 is less than a current level of the boost voltage, $V_{bst}$. If yes, then the boost voltage level may be decreased at a defined rate. If not, then the method 500 determines at block 520 whether the desired voltage of block 504 is greater than a current level of the boost voltage, $V_{bst}$. If so, then the method 500 proceeds to block 522 to increase a boost voltage level at a defined rate. The defined rate for increasing the boost voltage level at block 522 may be faster than the defined rate of decrease at block 518. If not, then the method 500 may maintain a current level of the boost voltage, $V_{bst}$. The method 500 may be executed continuously for each portion of an audio signal received at the controller.

Figure 6:
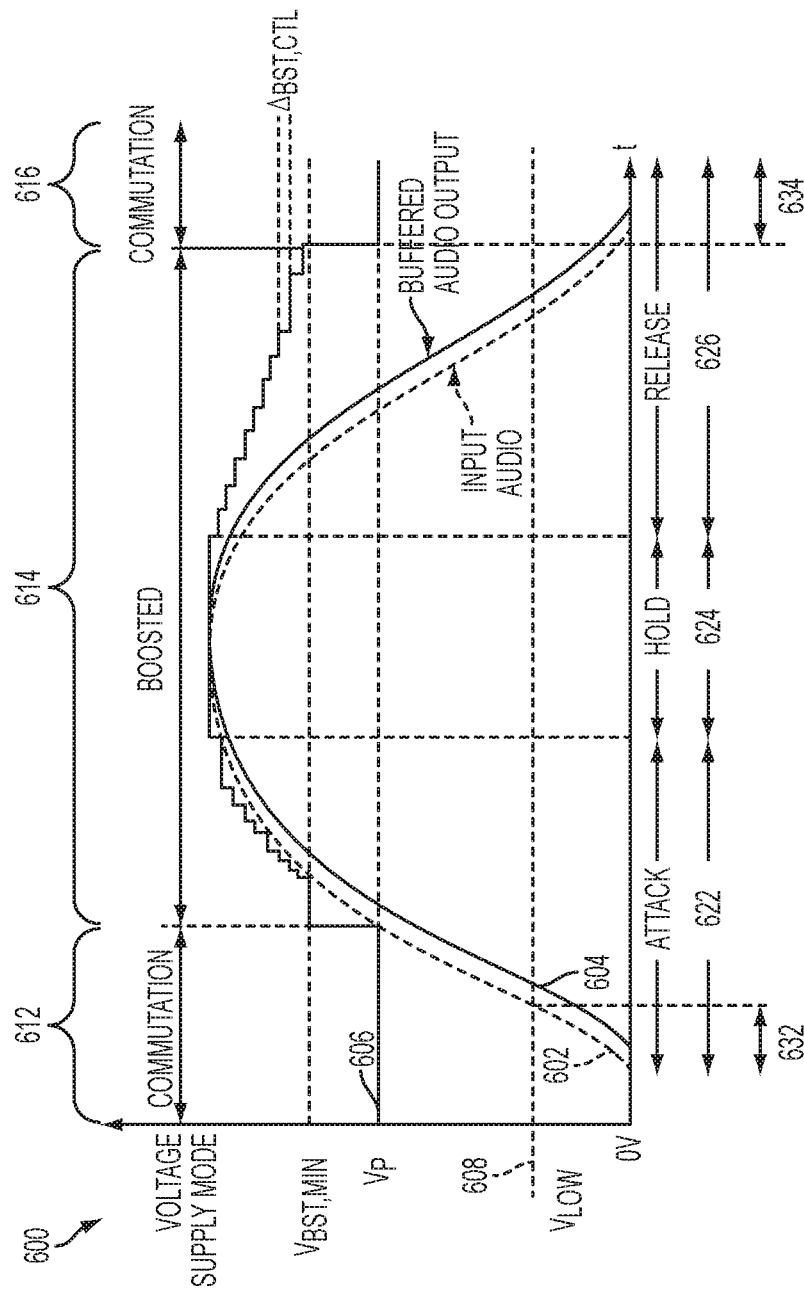
FIG. 6 is a graph illustrating an audio signal and an input voltage generated for an amplifier based on the audio signal according to one embodiment of the disclosure.

The operation of an audio amplifier with a variable boost converter is shown in FIG. 6. FIG. 6 is a graph illustrating an audio signal and an input voltage generated for an amplifier based on the audio signal according to one embodiment of the disclosure. A graph 600 includes a line 602 showing an input audio signal to a controller, such as the controller 222 of FIG. 4. A line 604 illustrates a delayed audio signal provided to the DAC 310 and the amplifier 308 of FIG. 3 due to buffering in the memory 402 of FIG. 4. A line 606 illustrates an output level of a boost voltage, $V_{bst}$, output from a boost converter, such as the boost converter 306 of FIG. 3. During an initial time period 606 the audio signal level 602 is below the supply voltage level, $V_p$. Thus, the amplifier operates from the boost converter and the boost converter is configured in commutation mode to pass the supply voltage, $V_p$, to the amplifier. During time period 614 the audio signal level 602 is above the supply voltage, $V_p$, thus the boost converter activates to first generate a minimum boosted voltage, $V_{boost,min}$. As the audio signal 602 increases the boost voltage level 606 is also increased. As the audio signal 602 decreases the boost voltage level 606 is also decreased. When the boost voltage level decreases back to the minimum boosted voltage, $V_{boost,min}$, the boost converter may switch back to commutation mode during time period 616.

When adjusting the boost voltage level 606 the rate at which the level increases may be different from the rate at which the level decreases. For example, during an attack time period 622 when the audio signal level 602 is increasing the boost voltage level 606 may be increased at a fast rate. Then, during a release time period 626 when the audio signal level 602 is decreasing the boost voltage level 606 may be decreased at a slower rate than the increase during the attack time period 622. Near a peak of the audio signal level 602 the boost voltage level may be held constant during a hold time period 624 Likewise, any time a change in the audio signal level 602 is smaller than a minimum control change of the boost converter, $\Delta V_{bst,ctrl}$, the boost voltage level may be held constant.

A faster increase rate of the boost voltage level may prevent amplifier clipping, while a slower decrease rate of the boost voltage level may prevent back-powering on the supply voltage. The increase rate and decrease rate of the boost voltage level may be adjusted to a desired balance of power efficiency and audio responsiveness. For example, the rate for increasing the boost voltage level may be slowed to decrease power consumption.

In one embodiment, in addition to controlling the boost voltage level of the boost converter, the amplifier may be switched between the boost converter and a low voltage converter. Thus, during a time period 632 during which the audio signal level 602 is lower than the low voltage, $V_{low}$, of line 608 the amplifier may be switched from the boost converter to the low voltage converter. Likewise, during a time period 634 after the boost converter has switched back to commutation mode and if the audio signal level 602 is below the low voltage, $V_{low}$, then the amplifier may be switched from the boost converter to the low voltage converter.

The embodiments of amplifier control described above allow more power efficient operation of an audio amplifier, such as in portable devices. For example, an amplifier may be switched between a low voltage converter and a boost converter to reduce usage of the boost converter when audio signal levels are low. In another example, a boost voltage level of the boost converter may be controlled to reduce headroom waste during amplification when the audio signal level is low. These control techniques and others described above allow decreased power consumption and increased battery life in devices having an audio amplifier. Additional benefits, such as decreased thermal loading by the audio amplifier and decreased electromagnetic interference (EMI) from the audio amplifier are also obtained from these control techniques. Thus, the control techniques may improve operation of audio amplifiers in both mobile devices and fixed devices.

If implemented in firmware and/or software, the operations described above, such as with reference to FIG. 5, may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method, comprising:
    receiving, at a controller, an audio signal;
    configuring, by the controller, a boost converter for a boost voltage based, at least in part, on the received audio signal, wherein the controller configures the boost converter to generate a boost voltage that approximately follows an amplitude of the audio signal, and wherein the boost converter generates the boost voltage by:
        building current in an inductor in a first phase; and
        discharging current from the inductor to a capacitor during a second phase; and
    amplifying, at an amplifier coupled to the controller and the boost converter, the audio signal based, at least in part, on the boost voltage of the boost converter.

2. The method of claim 1, further comprising configuring, by the controller, the amplifier to amplify the audio signal with a low voltage based, at least in part, on the received audio signal.

3. The method of claim 2, wherein the step of configuring the amplifier comprises:
    configuring the amplifier to amplify the audio signal with a low voltage lower than a supply voltage when the audio signal is smaller in amplitude than the low voltage; and
    configuring the amplifier to amplify the audio signal with a boost voltage higher than the supply voltage when the audio signal is greater in amplitude than the low voltage.

4. The method of claim 1, further comprising buffering the audio signal in a buffered audio signal, wherein the configuring is based on the buffered audio signal and wherein the amplifying comprises amplifying the buffered audio signal.

5. The method of claim 1, wherein the step of configuring the boost converter comprises configuring the boost converter to output a voltage approximately equal to a sum of an amplitude of the audio signal and a headroom value.

6. The method of claim 5, wherein the step of configuring the boost converter further comprises:
    increasing the boost voltage at a first rate when the audio signal increases; and
    decreasing the boost voltage at a second slower rate when the audio signal decreases.

7. The method of claim 1, wherein the steps of configuring and amplifying are performed by a single integrated circuit (IC).

8. The method of claim 1, further comprising modulating the audio signal with a modulator for output to a speaker or headphone.

9. The method of claim 1, wherein building current in an inductor in a first phase comprises activating a first switch between the inductor and a ground and deactivating a second switch between the inductor and the capacitor, and wherein discharging current from the inductor to a capacitor during a second phase comprises deactivating the first switch between the inductor and a ground and activating the second switch between the inductor and the capacitor.

10. The method of claim 1, wherein the step of configuring the boost converter comprises monitoring a current through the inductor and controlling the boost converter based, at least in part, on the current through the inductor.

11. The method of claim 1, wherein the step of configuring the boost converter comprises monitoring a voltage level of a supply voltage to the boost converter, and controlling the boost converter based, at least in part, on the supply voltage.

12. The method of claim 1, wherein the step of configuring the boost converter comprises maintaining the boost voltage when a change in a desired boost voltage is less than a threshold minimum change voltage.

13. The method of claim 1, wherein the step of configuring the boost converter comprises sending a mode signal from the controller to the boost converter.

14. The method of claim 3, wherein the step of configuring the amplifier to amplify the audio signal with a low voltage lower than a supply voltage comprises configuring the amplifier to operate from a low voltage converter when the low voltage is lower than a low voltage threshold, and configuring the amplifier to operate from the boost converter in a commutation mode, when the low voltage is lower than the supply voltage but greater than the low voltage threshold.

15. The method of claim 4, further comprising delaying the buffered audio signal to match a latency introduced by a latency of the controller.

16. The method of claim 5, wherein the headroom value is a fixed predetermined value.

17. A computer program product, comprising:
    a non-transitory computer readable medium comprising code to perform steps comprising:
        receiving an audio signal;
        configuring a boost converter for a boost based, at least in part, on the audio signal by configuring the boost converter to generate a boost voltage that approximately follows an amplitude of the audio signal; and configuring the amplifier to amplify the audio signal based, at least in part, on the audio signal, and wherein the step of configuring the amplifier comprises:
  configuring the amplifier to amplify the audio signal with a low voltage lower than a supply voltage when the audio signal is smaller in amplitude than the low voltage; and
  configuring the amplifier to amplify the audio signal with a boost voltage higher than the supply voltage when the audio signal is greater in amplitude than the low voltage.

18. The computer program product of claim 17, wherein the step of configuring the boost converter comprises configuring the boost converter to output a voltage approximately equal to a sum of an amplitude of the audio signal and a headroom value.

19. The computer program product of claim 17, wherein the step of configuring the boost converter further comprises:
  increasing the boost voltage at a first rate when the audio signal increases; and
  decreasing the boost voltage at a second slower rate when the audio signal decreases.

20. The computer program product of claim 17, wherein the step of configuring the amplifier to amplify the audio signal with a low voltage lower than a supply voltage comprises configuring the amplifier to operate from a low voltage converter when the low voltage is lower than a low voltage threshold, and configuring the amplifier to operate from the boost converter in a commutation mode, when the low voltage is lower than the supply voltage but greater than the low voltage threshold.

* * * * *